(12) United States Patent
Fujimura et al.

(10) Patent No.: US 8,080,936 B2
(45) Date of Patent: Dec. 20, 2011

(54) DISPLAY DEVICE WITH IMPROVED MOISTURE PREVENTION

(75) Inventors: Hiroshi Fujimura, Aichi (JP); Masumitsu Ino, Kanagawa (JP); Mitsuru Asano, Kanagawa (JP); Akira Yumoto, Kanagawa (JP); Yuichi Iwase, Kanagawa (JP)

(73) Assignee: Sony Corporation, Tokyo (JP)

( * ) Notice: Subject to any disclaimer, the term of this patent is extended or adjusted under 35 U.S.C. 154(b) by 170 days.

(21) Appl. No.: 11/193,864

(22) Filed: Jul. 29, 2005

(65) Prior Publication Data

US 2006/0033429 A1 Feb. 16, 2006

(30) Foreign Application Priority Data

Aug. 12, 2004 (JP) ................................ P2004-235125

(51) Int. Cl.
*H05B 33/22* (2006.01)

(52) U.S. Cl. .......................... 313/506; 313/504; 313/509

(58) Field of Classification Search .......... 313/498–512; 428/690–691, 917; 438/26–29, 34, 82; 257/40, 257/72, 98–100, 642–643, 759; 427/532–535, 427/539
See application file for complete search history.

(56) References Cited

U.S. PATENT DOCUMENTS

| | | | | |
|---|---|---|---|---|
| 7,053,549 | B2 * | 5/2006 | Omura et al. ................. | 313/512 |
| 7,202,927 | B2 * | 4/2007 | Murade ......................... | 349/138 |
| 2003/0127651 | A1 * | 7/2003 | Murakami et al. .............. | 257/72 |
| 2003/0227253 | A1 * | 12/2003 | Seo et al. ....................... | 313/504 |
| 2004/0061437 | A1 * | 4/2004 | Ikagawa ........................ | 313/506 |
| 2004/0185301 | A1 * | 9/2004 | Tsuchiya et al. .............. | 428/690 |
| 2005/0012454 | A1 * | 1/2005 | Yamazaki et al. ............. | 313/506 |
| 2006/0028133 | A1 * | 2/2006 | Kondo et al. .................. | 313/512 |

FOREIGN PATENT DOCUMENTS

| | | |
|---|---|---|
| JP | 2001-242827 | 9/2001 |
| JP | 2002-287663 | 10/2002 |
| JP | 2003-150079 | 5/2003 |
| JP | 2003-229250 | 8/2003 |
| JP | 2003-233332 | 8/2003 |
| JP | 2004-046110 | 2/2004 |
| JP | 2004-220870 | 8/2004 |
| JP | 2004-335267 | 11/2004 |
| JP | 2005-164818 | 6/2005 |
| JP | 2005-302707 | 10/2005 |
| JP | 2006-004909 | 1/2006 |
| WO | WO-2004/057920 | 10/2003 |

OTHER PUBLICATIONS

Japanese Office Action dated Jun. 20, 2008.
Japanese Office Action issued on Mar. 10, 2009 corresponding to JP Application No. 2004-235125.
Japanese Office Action issued on Mar. 23, 2011 in connection with counterpart JP Application No. 2008-214860.

* cited by examiner

*Primary Examiner* — Toan Ton
*Assistant Examiner* — Fatima Farokhrooz
(74) *Attorney, Agent, or Firm* — SNR Denton US LLP

(57) ABSTRACT

In a display device including, a display area having a plurality of organic EL devices on a substrate; a peripheral area having a driving circuit for the organic EL devices and surrounding the display area on the substrate; and an organic insulating film covering at least the driving circuit, the organic insulating film has a separating groove which divides itself into the inner part and outer part at the periphery of the display area.

8 Claims, 6 Drawing Sheets

DISPLAY DEVICE WITH IMPROVED MOISTURE PREVENTION

CROSS REFERENCES TO RELATED APPLICATIONS

The present invention contains subject matter related to Japanese Patent Application JP2004-235125 filed in the Japanese Patent Office on Aug. 12, 2004, the entire contents of which being incorporated herein by reference.

BACKGROUND OF THE INVENTION

1. Field of the Invention

The present invention relates to a display device and particularly relates to a display device suitable for the application to an organic EL display device.

2. Description of the Related Art

An organic EL device containing an organic material, electroluminescence (called EL hereinafter), is now popular as a light-emitting device, which can emit high intensity light through low-voltage direct-current driving. However, in such a device including organic EL devices (that is, an organic EL display device), moisture may deteriorate an organic layer of the device, which may lower the intensity of emitted light in each of the devices and/or may cause unstable light emission.

Conventionally as shown in FIG. 6, the organic EL devices on the substrate 101 are sealed by a cover member 102 and a sealant 103. Also, a rigid carbon film may be further provided at the outside of the sealant 103. Thus, the organic EL devices on the substrate 101 can be shielded from the outside, especially from moisture and oxygen which may cause the oxidization of the organic EL devices and prompt the deterioration of the devices (see Patent Document 1 below).

In FIG. 7, the cover member 102 is bonded via an adhesive 105 onto a device side 101a of the substrate 101 having organic EL devices and/or a circuit.

Patent Document 1: JP-A-2002-93576

SUMMARY OF THE INVENTION

However, in such devices, the spread of the moisture remaining within the display device is not completely prevented.

In particular, an inter-layer insulating film covering a driving circuit is made of an organic photo-sensitive material and allows water to pass through easily. Therefore, the moisture left within the display device easily spread via the inter-layer insulating film.

Accordingly, it is desirable to propose a display device which can prevent the deterioration of organic EL devices due to the spread of moisture remaining within the display device for higher long-term reliability.

According to an embodiment of the present invention, there is provided a display device including, a display area having a plurality of organic EL devices on a substrate; a peripheral area having a driving circuit for the organic EL devices and surrounding the display area on the substrate; and an organic insulating film covering at least the driving circuit, the organic insulating film has a separating groove which divides itself into the inner part and outer part at the periphery of the display area.

In such a device, the separating groove divides the organic insulating film into the inner part and outer part. Therefore, the deterioration of the organic EL devices due to moisture in the display area can be reduced by preventing moisture in the outer part of the organic insulating film from moving into the inner part of the organic insulating film. The separating groove is preferably provided between the display area and the peripheral area, so that the moisture in the peripheral area is prevented from moving into the display area through the organic insulating film.

DESCRIPTION OF THE PREFERRED EMBODIMENTS

Embodiments of a display device of the invention will be described below in detail with reference to drawings.

First Embodiment

Figure 1A:
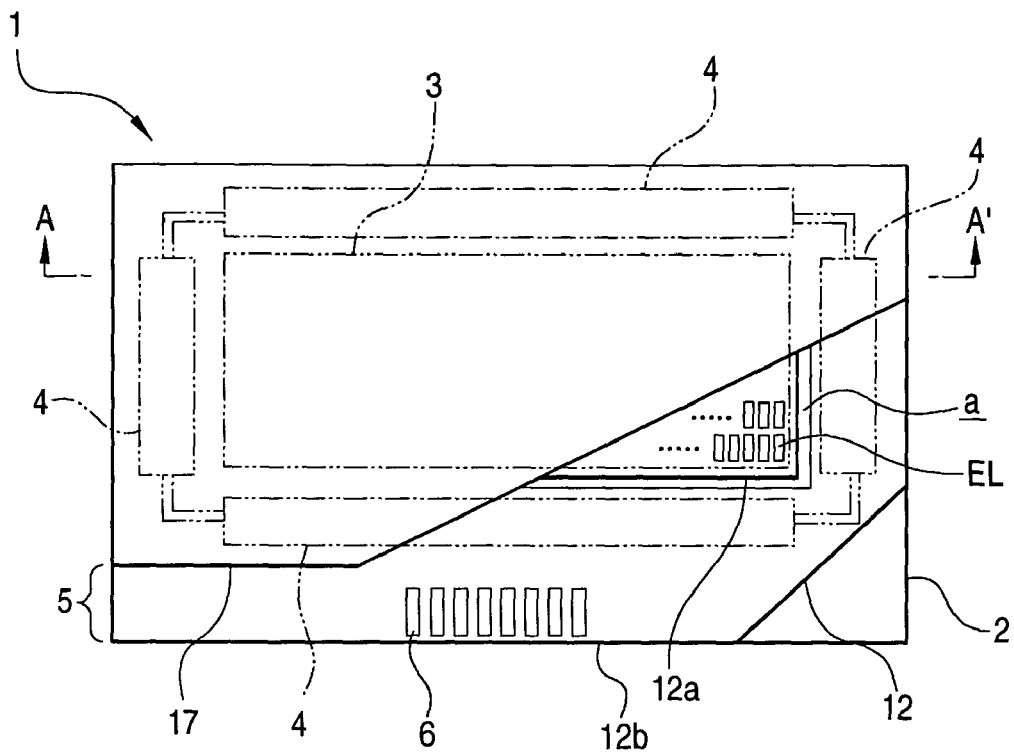
FIGS. 1A and 1B are diagrams showing a construction of a display device of a first embodiment.
Figure 1B:
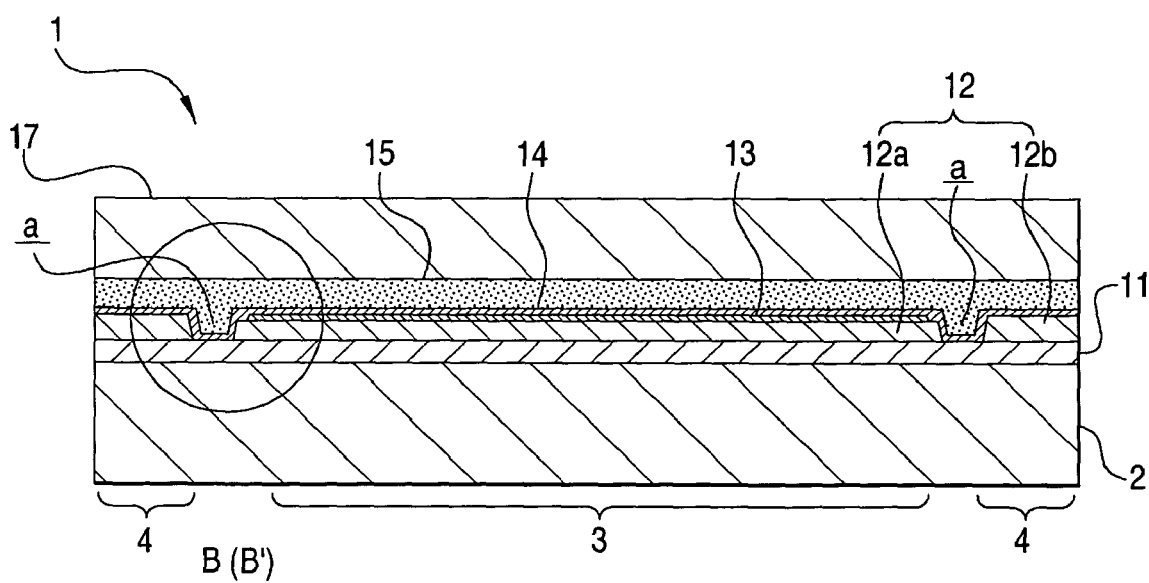

FIG. 1A is a plan view showing a construction of a display device of a first embodiment, and FIG. 1B is a schematic section view taken at Line A-A' in FIG. 1A.

First of all, as shown in the plan view in FIG. 1A, a display device 1 is an organic EL display device including organic EL devices EL serving as light emitting elements. On a substrate (which is a supporting substrate here) 2, the display device 1 includes a display area 3, a peripheral area 4 surrounding the display area 3, and an implemented area 5. The substrate 2 is made of a transparent material such as glass. The display area 3 has a plurality of organic EL devices EL. An IC chip and/or a circuit substrate are implemented on the implemented area 5.

In the display area 3, each of pixels on the supporting substrate 2 has an organic EL device EL. When the display device 1 is an active-matrix display device, each pixel has an organic EL device and a pixel circuit (not shown) for driving the organic EL device. Each of the pixel circuits has a thin-film transistor serving as a switching element.

The peripheral area 4 surrounding the display area 3 has driving circuits (not shown) for transmitting a scan signal and/or a data signal to the organic EL devices EL. Each of the driving circuits includes a thin-film transistor. The driving circuits in the peripheral area 4 are connected to each other.

The implemented area 5 may have an array of terminals 6 for inputting an external signal to the driving circuits in the peripheral area 4, for example.

The display device 1 including the display area 3, peripheral area 4 and implemented area 5 as described above has the construction as shown in FIGS. 1A and 1B. In other words, a circuit-formed layer 11 (shown in the section view only) is provided on the supporting substrate 2. The circuit-formed layer 11 has the pixel circuits in the display area 3 and driving circuits in the peripheral area 4. An organic insulating film 12 covers the circuit-formed layer 11 on the supporting substrate 2. Here, the organic insulating film 12 serves as a flattening insulating film.

An EL layer 13 (shown in the section view only) is provided on the surface flattened by the organic insulating film 12. The EL layer 13 has a plurality of organic EL devices EL. An inorganic insulating film 14 (shown in the section view only) covers the organic EL devices EL (that is, EL layer 13) in the display area 3 and peripheral area 4. Notably, the implemented area 5 does not have the inorganic insulating film 14.

The display area 3 and peripheral area 4 covered by the inorganic insulating film 14 further have an adhesive layer 15 (shown in the section view only). The supporting substrate 2 is bonded to an opposite substrate 17 through the adhesive layer 15 so that the organic EL devices EL in the display area 3 can be sealed. The adhesive layer 15 contains an extremely low pervious material.

In the plan view in FIG. 1A, a part of the organic insulating film 12 and opposite substrate 17 is cut out for easy description.

In the display device 1 of the first embodiment having this layer structure as described above, the organic insulating film 12 has a separating groove a. The separating groove a separates the organic insulating film 12 into an inner part 12a and outer part 12b.

The separating groove a is a groove-shaped part resulting from the complete removal of the organic insulating film 12 and at least surrounds a part of the display area 3 and preferably surrounds the entire circumference of the display area 3. The separating groove a is further preferably provided between the display area 3 and the peripheral area 4 as shown in FIG. 1A.

Figure 2A:
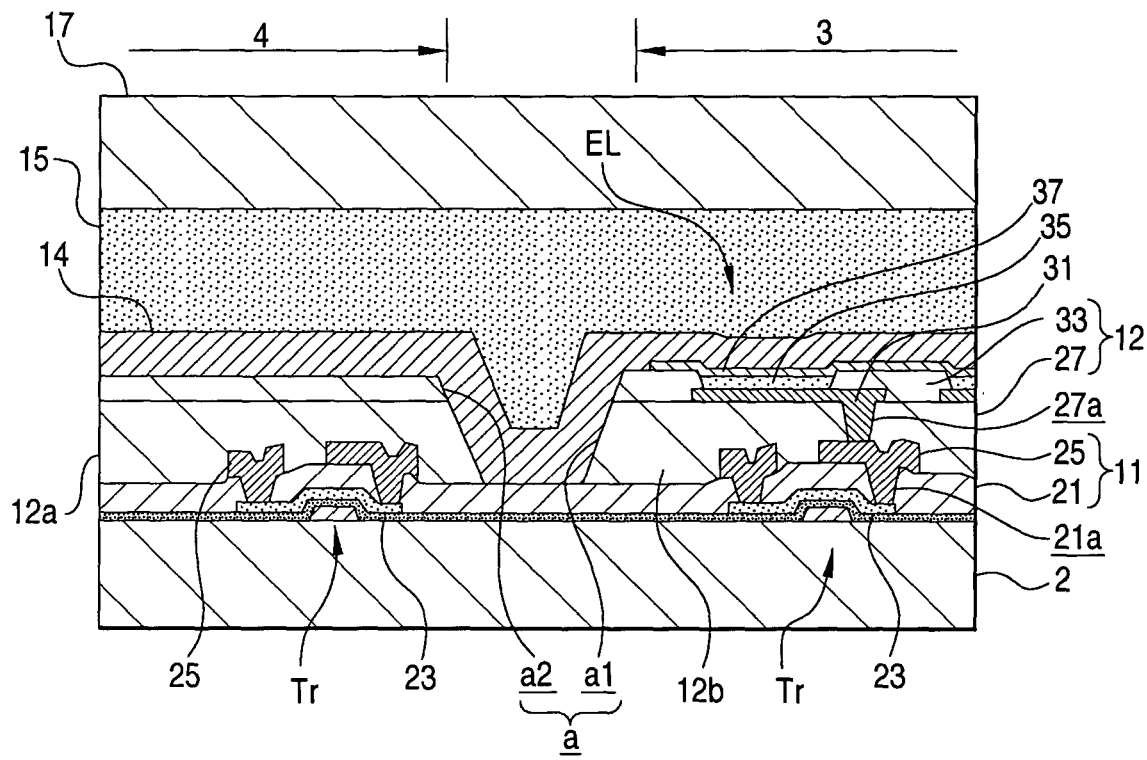
FIGS. 2A and 2B are main part enlarged section views showing a construction of the display device of the first embodiment.
Figure 2B:
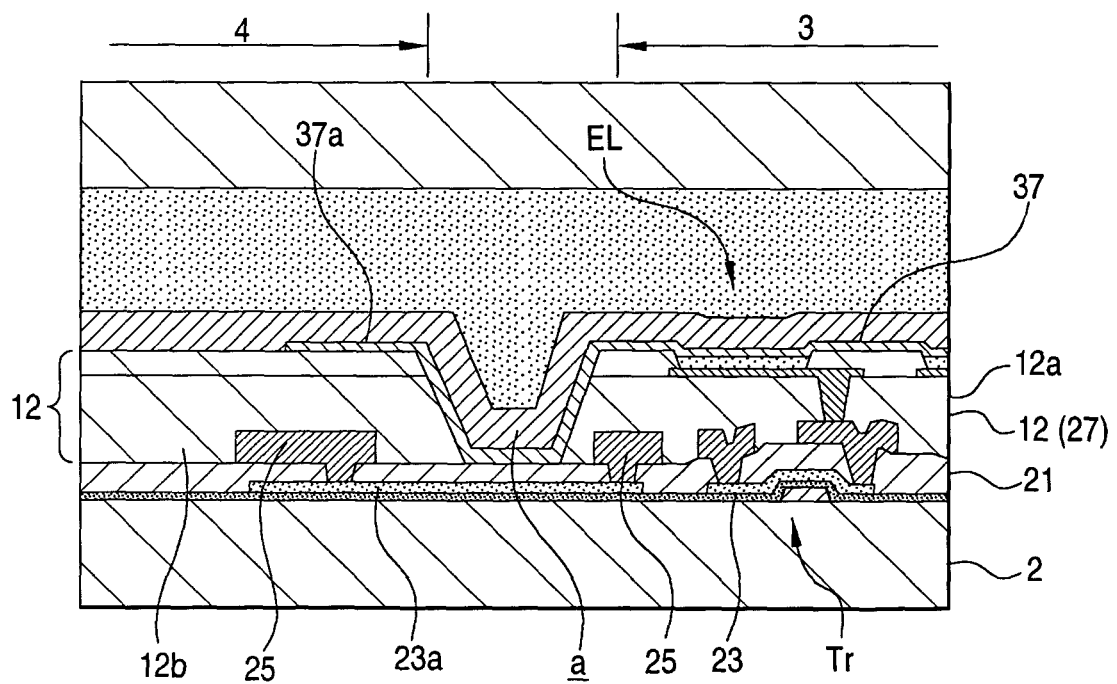

FIG. 2A shows an enlarged section view of Part B in the schematic section diagram in FIG. 1B, and FIG. 2B shows an enlarged section view of Part B' in the schematic section view in FIG. 1B. Note that Parts B and B' overlap one another in the depth direction in FIG. 1B. Detailed layer structures of the separating groove a and the surrounding will be described with reference to FIGS. 1A and 1B and based on the enlarged section views in FIGS. 2A and 2B.

As shown in FIG. 2A, the display area 3 and peripheral area 4 on the supporting substrate 2 have thin-film transistors Tr included in the pixel circuit and driving circuits, and an inorganic insulating film 21 covers the thin-film transistors Tr therein. A wiring 25 is provided on the inorganic insulating film 21. The wiring 25 is connected to a semiconductor layer 23 included in the sources and drains of the thin-film transistors Tr through connection holes 21a in the inorganic insulating film 21. The thin-film transistors Tr and wiring 25 are included in the pixel circuits of the display area 3 and the driving circuits of the peripheral area 4. These components described up to this point are included in the circuit-formed layer 11 described with reference to FIG. 1B.

A first organic insulating film 27 covers the wiring 25 on the inorganic insulating film 21. The first organic insulating film 27 contains a photo-sensitive compound and is coated as a flattening insulating film. The first organic insulating film 27 has a separating groove a1 between the display area 3 and the peripheral area 4 so that the display area 3 is surrounded. The separating groove a1 is formed by lithography processing.

The display area 3 on the first organic insulating film 27 has a plurality of organic EL devices EL. The organic EL devices EL have a lower electrode 31 connecting to the wiring 25 through a connection hole 27a in the first organic insulating film 27. The lower electrode 31 is to be used as an anode (or cathode) and is patterned as a pixel electrode. The periphery of the lower electrode 31 is covered by a second organic insulating film 33 and is widely exposed at the center part only. The second organic insulating film 33 may contain a photo-sensitive compound, for example. Lithography processing is used to form an opening above the lower electrode 31 and a separating groove a2 over the separating groove a1 of the first organic insulating film 27.

Thus, according to the first embodiment, the first organic insulating film 27 and the second organic insulating film 33 are included in the organic insulating film 12 described with reference to FIGS. 1A and 1B. The separating groove a1 in the first organic insulating film 27 and the separating groove a2 in the second organic insulating film 33 form the separating groove a described with reference to FIGS. 1A and 1B.

An organic layer 35 including a light-emitting layer at least is patterned and stacked on the lower electrodes 31 exposing from the second organic insulating film 33. The light-emitting layer in the organic layer 35 contains an organic material, which emits light in response to the re-coupling of positive holes and electrons implanted to the light-emitting layer. An upper electrode 37 is provided on the patterned organic layer 35 and the second organic insulating film 33. Here, the upper electrode 37 is isolated from the lower electrode 31. The upper electrode 37 is to be used as a cathode (or anode), is provided as an electrode common to the organic EL devices EL and covers the display area 3.

Here, the EL layer 13 described with reference to FIG. 1B is the layer having a plurality of organic EL devices EL in the construction as described above.

The inorganic insulating film 14 and adhesive layer 15 cover the organic insulating film 12 and organic EL devices EL, and the opposite substrate 17 is provided thereon.

As shown in FIG. 2B, the upper electrode 37 for the organic EL devices EL has an end extending as an upper electrode wiring 37a in the peripheral area 4 and connecting, at predetermined positions, to the driving circuits in the peripheral area 4. Thus, the upper electrode wiring 37a extends to the peripheral area 4 across the separating groove a surrounding the display area 3. Therefore, securing an enough thickness of the organic insulating film 12 (that is, the first organic insulating film 27) is important for maintaining isolation between the wiring 25 in the display area 3 and the peripheral area 4 and the upper electrode wiring 37a.

At place where the upper electrode wiring 37a crosses the separating groove a, the wiring 25 in the display area 3 and the wiring 25 in the peripheral area 4 are connected through a connection wiring below the inorganic insulating film 21. In this case, for example, the semiconductor layer part of the same layer as the semiconductor layer 23 included in the thin-film transistors Tr may be a connection wiring 23a so that the connection wiring 23a can connect the wiring 25 in the display area 3 and the wiring 25 in the peripheral area 4. Thus, the wiring 25 in the display area 3 and the wiring 25 in the peripheral area 4 can be connected each other without a short circuit with respect to the electrode wiring 37a.

In display device 1, the separating groove a in the organic insulating film 12 surrounding the display area 3 divides the organic insulating film 12 into the inner part 12a and the outer part 12b, as described with reference to FIGS. 1A and 1B and 2A and 2B. Thus, the moisture existing in the part corresponding to the outer part 12b of the organic insulating film 12 does not enter into the inner part 12a through the organic insulating film 12. Therefore, the deterioration of the organic EL devices EL due to moisture can be prevented in the display area 3 positioned at the part covered by the inner part 12a.

In particular, the separating groove a surrounding the display area 3 and between the display area 3 and the peripheral area 4 can prevent the entry of the moisture existing in the peripheral area 4 having the driving circuits into the display area 3 through the organic insulating film 12. Therefore, even when moisture is absorbed to a foreign material (such as dust) caused in a process of manufacturing the driving circuits in the peripheral area 4, the entry of the moisture into the display area 3 can be prevented, which can further prevent the deterioration of the organic EL devices more effectively. Preferably, the separating groove a is provided surrounding the display area 3 as closely as possible to the display area 3. Thus, the volume of the inner part 12a of the organic insulating film 12 can be reduced, and the amount of moisture that reaches to the organic EL devices EL through the part can be therefore reduced.

As a result, the long-term reliability of the display device 1 can be achieved since the deterioration of the organic EL devices EL due to moisture can be prevented.

Second Embodiment

Figure 3A:
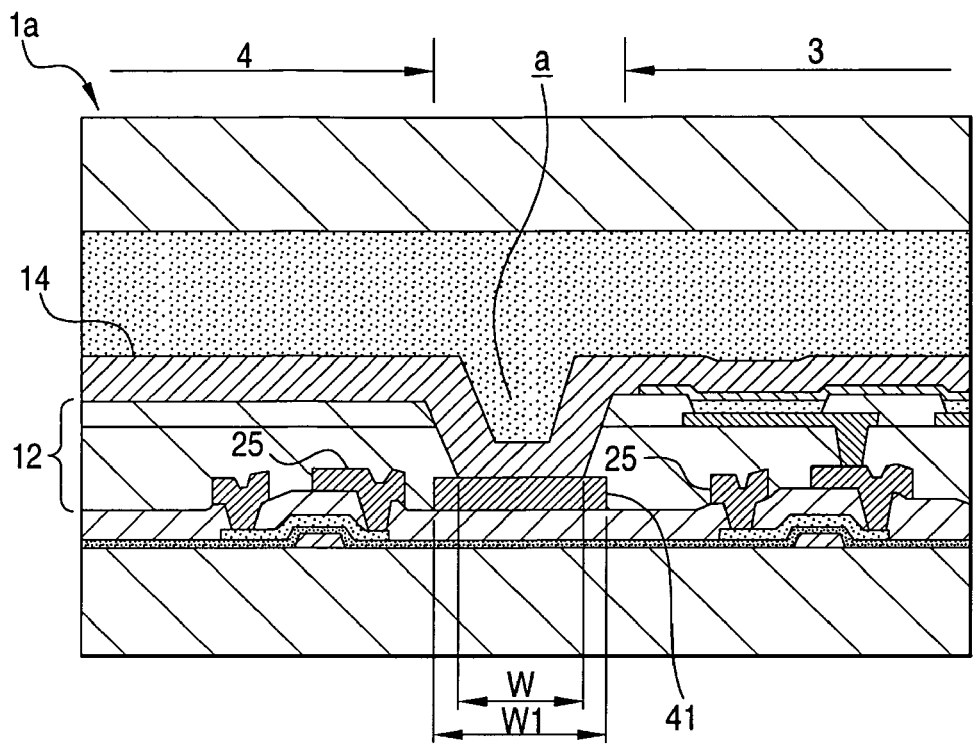
FIGS. 3A and 3B are main part enlarged section views showing a construction of a display device of a second embodiment.
Figure 3B:
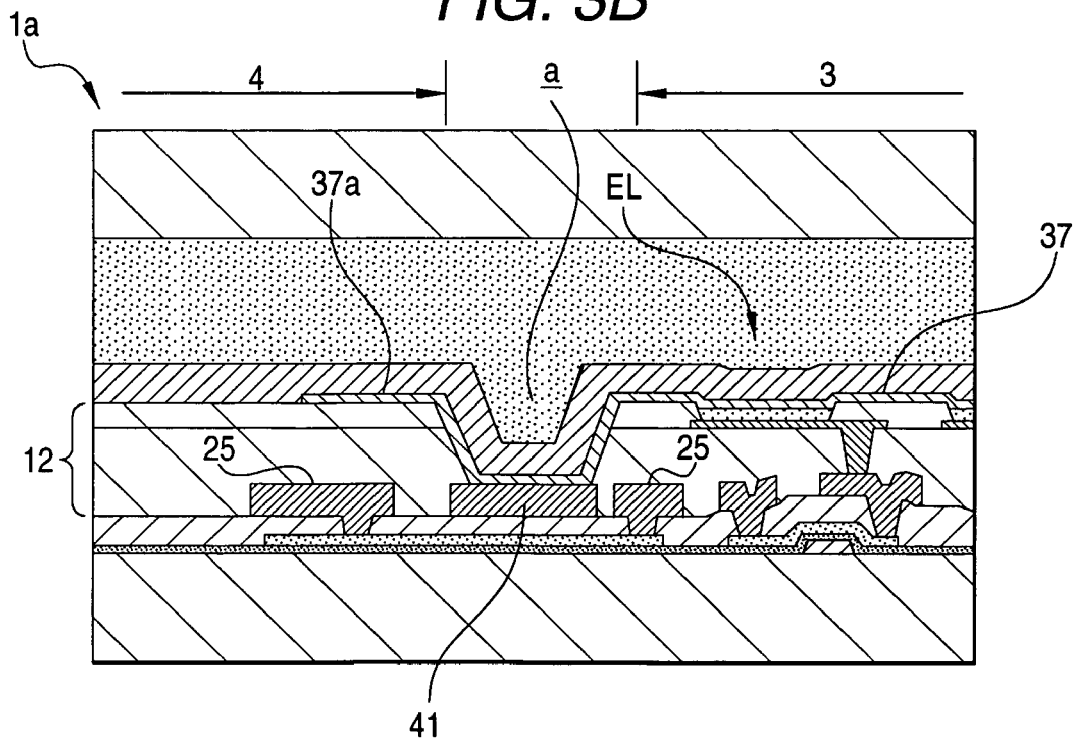

FIGS. 3A and 3B are main part enlarged section views showing features in a display device according to a second embodiment. FIG. 3A shows an enlarged section view corresponding to Part B in the schematic section view in FIG. 1B, and FIG. 3B shows an enlarged section view corresponding to Part B' in the schematic section view in FIG. 1B. A display device 1a according to the second embodiment shown in FIGS. 3A and 3B is different from the display device according to the first embodiment in that an inorganic layer 41 is provided at the bottom of the separating groove a for alleviating the degree of the level change due to the separating groove a. The other construction of the second embodiment is the same.

The inorganic layer 41 has a width W1, which is wider enough than the width W of the opening at the bottom of the separating groove a. The bottom of the separating groove a is configured to securely position on the inorganic layer 41 only so that the degree of the level change due to the separating groove a can be evenly alleviated. The inorganic layer 41 may be formed by patterning the same layer as that of the wiring 25 in the display area 3 and peripheral area 4. In this case, the inorganic layer 41 may be patterned with sufficient isolation from the wiring 25.

In particular, as shown in FIG. 3B, the upper electrode wiring 37a is connected and wired to the inorganic layer 41 containing the same material as that of the wirings 25 in the part where the upper electrode wiring 37a extending from the upper electrode 37 for the organic EL devices EL crosses the separating groove a.

Note that the inorganic layer 41 may contain an insulating material. Also in this case, the inorganic layer 41 has the width W1, which is wider enough than the width W of the opening at the bottom of the separating groove a, and the bottom of the separating groove a is configured to securely position on the inorganic layer 41 only.

Since the separating groove a of the organic insulating film 12 is provided between the display area 3 and peripheral area 4 also in this construction, the deterioration of the organic EL devices EL due to moisture in the display area 3 can be prevented like the first embodiment.

Furthermore, this embodiment has the inorganic layer 41 at the bottom of the separating groove a so that the degree of the level change due to the separating groove a can be alleviated. Thus, the stress on the part covering the level change due to the separating groove a can be alleviated in the inorganic insulating film 14 on the organic insulating film 12. Therefore, the occurrence of a crack due to the stress can be prevented, which can prevent the entry of moisture through the crack.

The alleviation of the degree of the level change due to the separating groove a can easily secure the thickness of the upper electrode wiring 37a extending to the peripheral area 4 across the separating groove a. Thus, the increase in resistant value and/or break of the upper electrode wiring 37a can be prevented in the side walls of the separating groove a.

Notably, the inorganic layer 41 for alleviating the degree of the level change due to the separating groove a can be provided without any increase in number of steps when the inorganic layer 41 is formed by patterning the same layer as that of the wiring 25 in the display area 3 and peripheral area 4.

Third Embodiment

Figure 4A:
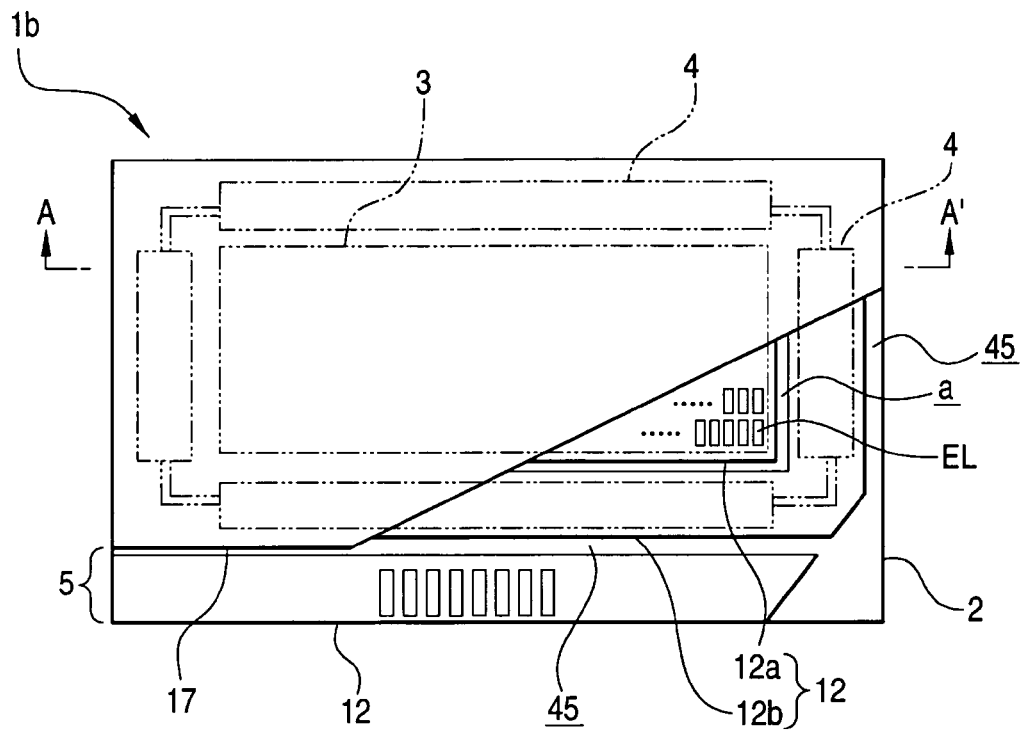
FIGS. 4A and 4B are diagrams showing a construction of a display device of a third embodiment.
Figure 4B:
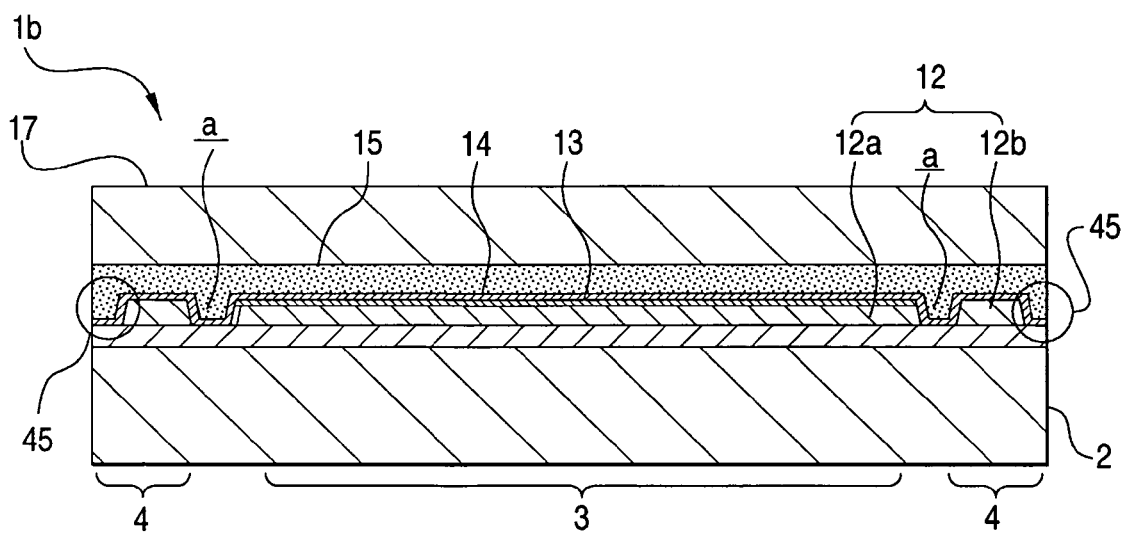

FIG. 4A is a plan view showing a construction of a display device according to a third embodiment, and FIG. 4B is a schematic section view taken at Line A-A' in FIG. 4A. A display device 1b shown in FIGS. 4A and 4B is different from the display devices of the embodiments above in that a sealed area 45 resulting from the removal of the organic insulating film 12 is provided in the outermost circumference of the part having the opposite substrate 17 over the supporting substrate 2, and the other construction is the same.

In other words, in the display device 1b, the separating groove a resulting from the removal of the organic insulating film 12 is provided between the display area 3 and the peripheral area 4 so that the display area 3 is surrounded. The sealed area 45 resulting from the removal of the organic insulating film 12 is provided surrounding the separating groove a and the perimeter of the peripheral area 4. The sealed area 45 is the outermost periphery of the part having the opposite substrate 17 over the supporting substrate 2 as described above. The outer part 12b of the organic insulating film 12 separated by the separating groove a has the both side walls and top face completely covered by the inorganic insulating film 14 (shown in the section view only) on the organic insulating film 12 and are sealed by the adhesive layer 15 (shown in the section view only). In other words, the organic insulating film 12 is not exposed to the outside in the part between the supporting substrate 2 and the opposite substrate 17.

In display device 1b, the deterioration of the organic EL devices EL due to moisture in the display area 3 can be prevented like the first embodiment since the separating groove a of the organic insulating film 12 is provided between the display area 3 and the peripheral area 4.

Furthermore, in the display device 1b of the third embodiment, the sealed area 45 resulting from the removal of the organic insulating film 12 and being provided at the outer edges of the supporting substrate 2 and opposite substrate 17 can prevent the entry of moisture from the outside of the display device 1b. Thus, the deterioration of the organic EL devices EL due to moisture in the display area 3 can be more securely prevented, and the corrosion of a metallic material due to moisture, for example, can be also prevented in the peripheral area 4.

Fourth Embodiment

Figure 5:
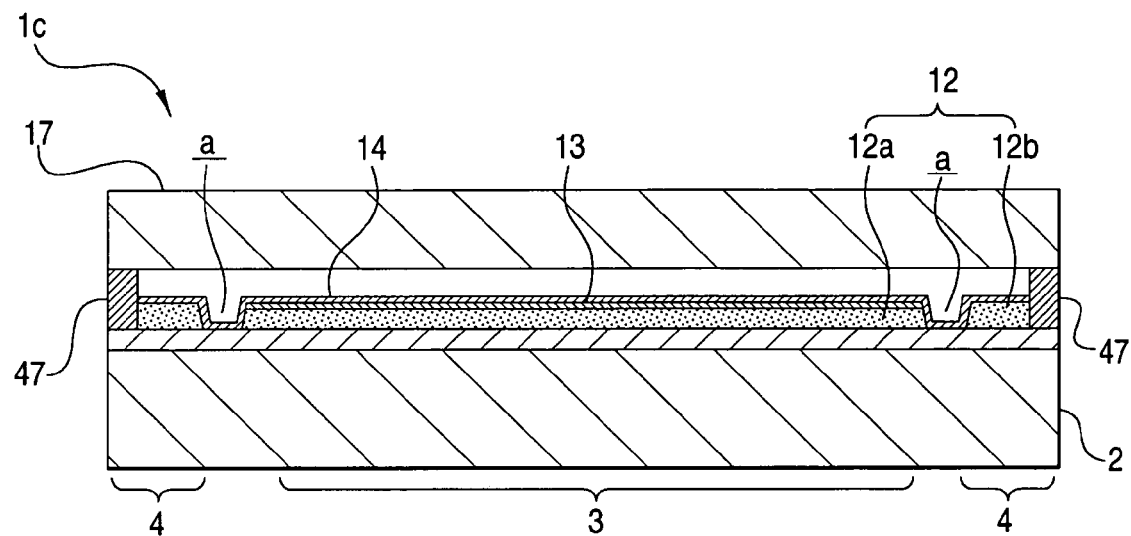
FIG. 5 is a schematic section view showing a construction of a display device of a fourth embodiment.
Figure 6:
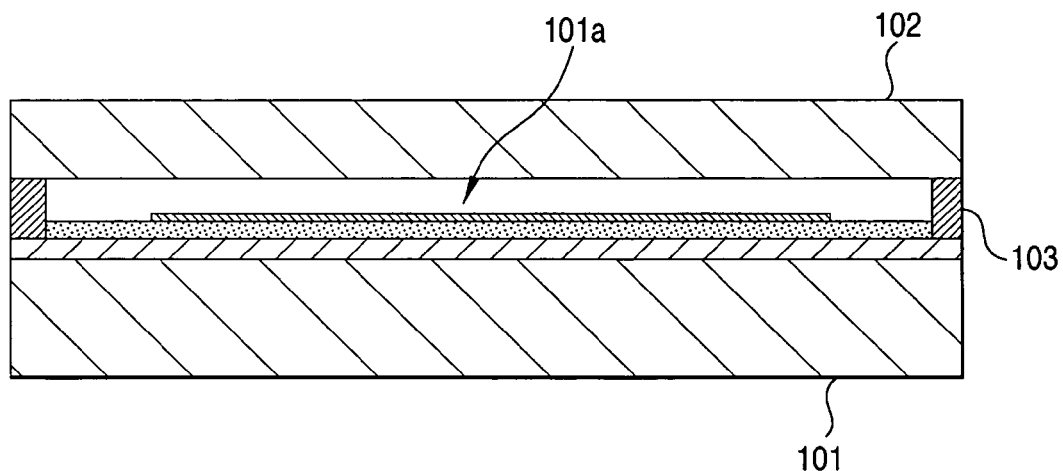
FIG. 6 is a schematic section view showing a construction of a display device in the past.
Figure 7:
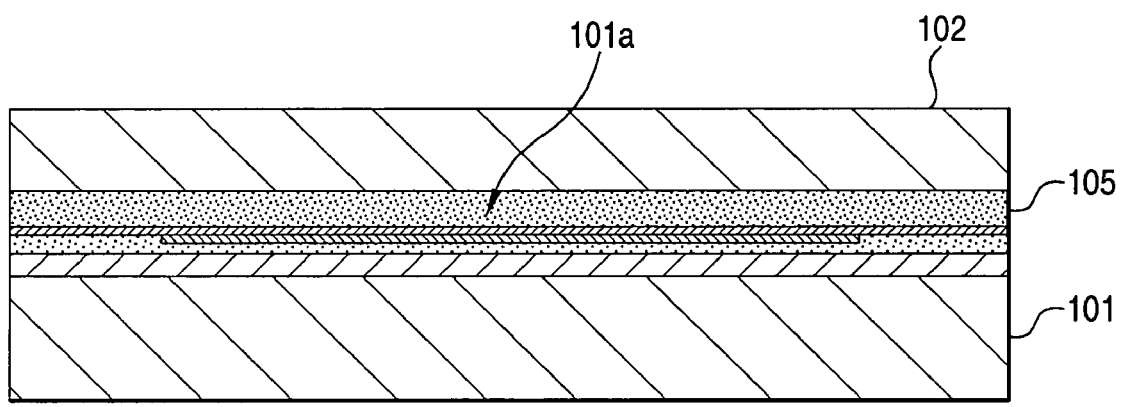
FIG. 7 is a schematic section diagram showing another construction of a display device in the past.

FIG. 5 is a schematic section view showing a construction of a display device according to a fourth embodiment. A display device 1c in FIG. 5 is different from the display device of the third embodiment in that a hollow part exists between the supporting substrate 2 and the opposite substrate 17, and the other construction is the same.

In other words, in the display device 1c, an adhesive sealant 47 is provided between the supporting substrate 2 and the opposite substrate 17 surrounding the separating groove a between the display area 3 and the peripheral area 4 and the perimeter of the peripheral area 4, resulting from the removal of the organic insulating film 12. The sealant 47 bonds the opposite substrate 17 to the supporting substrate 2 and seals the hollow part between the supporting substrate 2 and the opposite substrate 17.

Also in the display device 1c of the fourth embodiment, the deterioration of the organic EL devices EL due to moisture in the display area 3 can be prevented, and the reliability can be improved since the separating groove a of the organic insulating film 12 is provided between the display area 3 and the peripheral area 4.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
    a substrate having a display area and a main peripheral area surrounding the display area;
    a circuit layer on said substrate and having (1) within the display area, a plurality of organic electroluminescence (EL) device components, and (2) within the peripheral area, a driving circuit for the organic EL devices;
    a first organic insulating film covering said circuit layer;
    a second organic insulating film covering said first organic insulating film;
    a separating groove which extends thorough said first and second organic insulating films and which separates each of said first and second organic insulating films into an inner part and an outer part, said groove surrounding said inner parts;
    an organic electroluminescence (EL) layer in said display area on said inner part of said second organic insulating film and having emission components of said electroluminescence (EL) devices;
    a first inorganic insulating layer covering said organic electroluminescence (EL) layer, both the inner part and the outer part of said second organic insulating film and a floor and sidewalls of said separating groove;
    an upper electrode for the organic EL devices between said second organic insulating film and said first inorganic insulating layer, the upper electrode having an end extending from the display area, over said second organic insulating layer, across the floor and sidewalls of said groove, and to the peripheral area,
    wherein,
        said substrate has an outermost peripheral area spaced apart from said groove and surrounding said main peripheral area which is not covered by either said first organic insulating film or said second organic insulating film but which is covered by said first inorganic insulating layer, in an amount effective to create a moisture barrier, and
        said groove covered by said first inorganic insulating film is effective as a moisture barrier between said main peripheral area and said display area.

2. The display device according to claim 1, wherein:
    said first organic insulating film is further provided as a flattening insulating film embedding the driving circuit on the substrate; and
    a second inorganic layer is provided under a bottom of said separating groove so as to reduce a gap produced by the separating groove.

3. The display device according to claim 1, wherein a wiring disposed in the inner part and the wiring disposed in the outer part are connected by a wiring disposed under the first organic insulating film.

4. The display device according to claim 1, wherein said separating groove extends along the entire periphery of said display area.

5. The display device according to claim 1, further comprising an adhesive layer covering said first inorganic layer and filling said separating groove.

6. The display device according to claim 1, wherein the electrode wiring extends into the peripheral area and between said inorganic layer and said separating groove.

7. The display device according to claim 2, wherein:
    the second inorganic layer is made of an insulating material, and said upper electrode extends to the peripheral area.

8. The display device according to claim 5, further comprising a transparent substrate adhered to said adhesive layer.

* * * * *